United States Patent
Hourne

(10) Patent No.: US 9,778,300 B2
(45) Date of Patent: Oct. 3, 2017

(54) LOW CONSUMPTION DEVICE FOR MEASURING A VARIATION OF A CAPACITANCE AND ASSOCIATED METHOD

(71) Applicants: CONTINENTAL AUTOMOTIVE FRANCE, Toulouse (FR); CONTINENTAL AUTOMOTIVE GmbH, Hannover (DE)

(72) Inventor: Xavier Hourne, Cugnaux (FR)

(73) Assignees: CONTINENTAL AUTOMOTIVE FRANCE, Toulouse (FR); CONTINENTAL AUTOMOTIVE GmbH, Hannover (DE)

( * ) Notice: Subject to any disclaimer, the term of this patent is extended or adjusted under 35 U.S.C. 154(b) by 542 days.

(21) Appl. No.: 14/364,744

(22) PCT Filed: Dec. 17, 2012

(86) PCT No.: PCT/EP2012/005210
§ 371 (c)(1),
(2) Date: Jun. 12, 2014

(87) PCT Pub. No.: WO2013/091821
PCT Pub. Date: Jun. 27, 2013

(65) Prior Publication Data
US 2014/0372058 A1    Dec. 18, 2014

(30) Foreign Application Priority Data
Dec. 23, 2011    (FR) ...................................... 11 04050

(51) Int. Cl.
*G01R 27/26*    (2006.01)
*G01D 5/24*    (2006.01)
(Continued)

(52) U.S. Cl.
CPC ........... *G01R 27/2605* (2013.01); *G01D 5/24* (2013.01); *G01V 3/00* (2013.01); *H03K 17/955* (2013.01);
(Continued)

(58) Field of Classification Search
CPC .................................................. G01R 27/2605
See application file for complete search history.

(56) References Cited

U.S. PATENT DOCUMENTS 7,859,272 B2 * 12/2010 Liao ..................... H03K 17/955
324/678
8,629,685 B2    1/2014 Hourne
(Continued)

FOREIGN PATENT DOCUMENTS

CN    1766660 A    5/2006
CN    101499793 A    8/2009
(Continued)

OTHER PUBLICATIONS

International Search Report dated Mar. 7, 2013, corresponding to PCT/EP2012/005210.

*Primary Examiner* — Manuel L Barbee
*Assistant Examiner* — Raymond Nimox
(74) *Attorney, Agent, or Firm* — Young & Thompson

(57) ABSTRACT

A device for measuring a variation ($\Delta C_X$) of a capacitance ($C_X$), includes:
 elements for charging the capacitance ($C_X$) on the basis of a supply voltage ($V_{CC}$).
 elements for discharging the capacitance ($C_X$) into a reference capacitance ($C_S$) in a fixed number of discharges (x),
 elements for measuring a voltage ($V_S$) and for detecting a threshold of voltage ($V_{TH}$) across the terminals of the reference capacitance ($C_S$).

(Continued)

elements for charging with current ($I_C$) the reference capacitance ($C_S$) on the basis of the supply voltage ($V_{CC}$) for a duration (t), after the transfer of charge from the capacitance ($C_X$) into the reference capacitance ($C_S$), and elements for measuring the variation between the duration (t) with respect to a previously measured duration so as to estimate the variation ($\Delta C_X$) of the capacitance ($C_X$).

10 Claims, 3 Drawing Sheets

(51) Int. Cl.
 *H03K 17/955* (2006.01)
 *G01V 3/00* (2006.01)
(52) U.S. Cl.
 CPC ............ *H03K 2217/960715* (2013.01); *H03K 2217/960725* (2013.01)

(56) References Cited

U.S. PATENT DOCUMENTS

| | | | |
|---|---|---|---|
| 2005/0218913 A1* | 10/2005 | Inaba | G01D 5/24 324/678 |
| 2006/0055416 A1 | 3/2006 | Kinoshita et al. | |
| 2008/0142281 A1* | 6/2008 | Geaghan | G06F 3/044 178/18.06 |
| 2009/0167325 A1* | 7/2009 | Geaghan | G01D 5/24 324/660 |
| 2010/0231240 A1* | 9/2010 | Hourne | G01D 5/2405 324/686 |
| 2010/0283485 A1* | 11/2010 | Valisuo | G01D 5/24 324/663 |
| 2011/0163766 A1* | 7/2011 | Geaghan | G06F 3/044 324/678 |
| 2011/0210753 A1 | 9/2011 | Hourne | |

FOREIGN PATENT DOCUMENTS

| | | |
|---|---|---|
| CN | 102209881 A | 10/2011 |
| FR | 2 938 344 | 5/2010 |
| WO | 00/31553 A1 | 6/2000 |

* cited by examiner

LOW CONSUMPTION DEVICE FOR MEASURING A VARIATION OF A CAPACITANCE AND ASSOCIATED METHOD

The present invention relates to a charge-transfer capacitive sensor. More particularly, it pertains to the application of such a sensor in the door handles of a vehicle for so-called "hands free" access of an authorized user to his vehicle.

BACKGROUND OF THE INVENTION

Nowadays, certain motor vehicles are equipped with "hands free" access; that is to say the authorized user of the vehicle no longer needs a key to open the doors and other openable panels (hood, trunk, etc.) of his vehicle. In place of a key, he possesses an identification badge (or remote control) with which the vehicle electronic system interacts.

To invoke the opening of a door, for example, the driver approaches the handle of the door. A capacitive presence sensor, in this instance a charge-transfer capacitive sensor situated in the handle, detects the presence of the drivers hand. This sensor is connected to the electronic computer of the vehicle (ECU: English abbreviation for "Electronic Control Unit") and sends it a presence detection signal. The electronic computer of the vehicle has beforehand identified the user as being authorized to access this vehicle, or alternatively, subsequent to the reception of this detection signal, it undertakes this identification. Accordingly, it sends by way of an LF (English abbreviation for "Low Frequency") antenna an identification request to the badge (or to the remote control) worn or carried by the user. This badge sends in response, by RF (radio frequency) waves, its identification code to the electronic computer of the vehicle. If the electronic computer recognizes the identification code as that authorizing access to the vehicle, it triggers the opening of the door. If, on the other hand, the electronic computer has not received any identification code or if the identification code received is erroneous, opening does not occur.

As illustrated in FIG. 1, a capacitive sensor 3 such as this consists of an electrode 4 integrated into the handle 6 of the door and of a second electrode linked to ground. This second electrode can include a part of the body of a user and of a close environment linked directly or indirectly to ground. This may be, for example, the hand M of the user, the presence of which near the handle 6 of the door has to be detected.

When the user's hand M approaches the handle 6 of the door, that is to say it passes from position 1 to position 2 along the direction of the arrow illustrated in FIG. 1, the capacitance $C_X$ of the electrode 4 integrated into the handle 6 increases. The variation $\Delta C_X$ is measured with the aid of a reference capacitance $C_S$, situated on a printed circuit 5 connected to the electrode 4. If the value of the capacitance $C_X$ crosses a threshold, this gives rise to the validation of the detection. Indeed this means that the users hand M is in position 2, on the handle 6 of the door or sufficiently close to this handle 6 and that he is requesting access to the vehicle.

From the prior art it is known that the charge-transfer capacitive sensor 3 makes it possible to measure the variation $\Delta C_X$ of the capacitance $C_X$ of the electrode 4 integrated into the handle 6 of the door by performing a charge transfer consisting of a large number of charges and of discharges of this capacitance $C_X$ into the reference capacitance $C_S$, until a fixed threshold of voltage is attained across the terminals of the reference capacitance $C_S$. The estimation of the variation $\Delta C_X$ of the capacitance $C_X$ of the electrode 4 with respect to the previous cycle is carried out on the basis of the variation of the number of discharges of the capacitance $C_X$ of the electrode 4 into the reference capacitance $C_S$ that had to be performed so as to attain this threshold of voltage across the terminals of the reference capacitance $C_S$. These capacitive sensors 3 involve switching means which make it possible to direct the current so as firstly to charge the capacitance $C_X$ of the electrode 4 by way of the supply voltage and thereafter to discharge it into the reference capacitance $C_S$. The charge transfer, that is to say the succession of charges and discharges, according to the prior art, and illustrated in FIG. 2, breaks down into four steps:

1st step: the first step consists in charging the capacitance $C_X$ of the electrode 4 on the basis of the supply voltage $V_{CC}$. Accordingly the first switch S1 is closed and the second switch S2 is opened.

2nd step: once charging has finished, the first switch S1 is opened.

3rd step: then the discharging of the capacitance $C_X$ of the electrode 4 into the reference capacitance $C_S$ can begin. Accordingly, the first switch S1 remains open and the second switch S2 is closed.

4th step: once discharging has been carried out, the second switch S2 is opened.

The charge transfer is repeated until the voltage $V_S$ across the terminals of the reference capacitance $C_S$ attains the threshold voltage $V_{TH}$. The number of discharges x of the capacitance $C_X$ of the electrode 4 to the reference capacitance $C_S$ required to attain this threshold $V_{TH}$ gives an image of the capacitance $C_X$ of the electrode 4. The reference capacitance $C_S$ is thereafter completely discharged by way of the switch S in preparation for the next measurement.

A counter of the number of discharges x and a microcontroller (neither of which is represented in FIG. 2) make it possible to determine the capacitance $C_X$ of the electrode 4.

The equation governing the operation of the capacitive sensor 3 is the following:

$$V_S(x) = \frac{C_X}{C_S} \times V_{CC} + V_S(x-1) \times \left(1 - \frac{C_X}{C_S}\right)$$

The evolution of the voltage $V_S$ across the terminals of the reference capacitance $C_S$ constitutes a mathematical series according to the number of discharges x of the capacitance $C_X$ of the electrode 4 to the reference capacitance $C_S$, and is given by equation (1):

$$V_S(x) = V_{CC} \times \left(1 - \left(1 - \frac{C_X}{C_S}\right)^x\right) \qquad (1)$$

At the end of the charge transfer, the voltage $V_S$ across the terminals of the reference capacitance $C_S$ has reached the threshold voltage $V_{TH}$, and a number of discharges x is obtained, defined by equation (2):

$$x = -\frac{C_S}{C_X} \times \ln\left(1 - \frac{V_{TH}}{V_{CC}}\right) \qquad (2)$$

Th is defined as a detection threshold, corresponding to a number of charge transfers between the two states of the capacitance $C_X$ of the electrode 4, that is to say between $C_X$ and $C_X + \Delta C_X$.

Th is equal to the variation of the number of discharges x, between the value of the capacitance $C_X$ and the value of the capacitance $C_X + \Delta C_X$.

Consequently:

$$Th = -\frac{C_S}{C_X} \times \ln\left(1 - \frac{V_{TH}}{V_{CC}}\right) + \frac{C_S}{C_X + \Delta C_X} \times \ln\left(1 - \frac{V_{TH}}{V_{CC}}\right)$$

This gives:

$$\Delta C_X = \frac{-Th \times C_X^2}{C_S \times \ln\left(1 - \frac{V_{TH}}{V_{CC}}\right) - Th \times C_X}$$

As the reference capacitance $C_S$ is, according to the prior art, appreciably greater than the capacitance $C_X$ of the electrode 4, the following equation is obtained for the variation $\Delta C_X$ of the capacitance $C_X$:

$$\Delta C_X \approx \frac{-Th \times C_X^2}{C_S \times \ln\left(1 - \frac{V_{TH}}{V_{CC}}\right)} \quad (3)$$

This equation (3) is known to the person skilled in the art.

Consequently, the variation $\Delta C_X$ of the capacitance $C_X$ measurable by the capacitive sensor 3, (stated otherwise, the sensitivity of the latter), defined by equation (3) depends on numerous parameters: the value of the storage capacitance $C_S$, the supply voltage $V_{CC}$, the voltage threshold for stopping measurement $V_{TH}$ and especially chiefly on the capacitance of the electrode squared $C_X^2$. Now, the capacitance $C_X$ of the electrode 4 is difficult to control and varies as a function of the environment (temperature, humidity, etc.), thus degrading the value of the variation $\Delta C_X$ of the capacitance $C_X$ and therefore the sensitivity and the performance of the capacitive sensor 3.

Moreover, the number of discharges x which conditions the duration of measurement, is proportional to the reference capacitance $C_S$ (cf. equation (2)), which is itself dependent on the other parameters and in particular on the desired variation $\Delta C_X$ (cf. equation (3)). Thus for a variation $\Delta C_X$ of the capacitance $C_X$ which is given, there corresponds a value of the reference capacitance $C_S$ and therefore a fixed number of discharges x (Th, $V_{CC}$, $V_{TH}$, and $C_X$ being fixed parameters). Consequently, the number of discharges x, that is to say the duration of charge transfer, or the duration of measurement of the variation $\Delta C_X$ of the capacitance $C_X$ until detection, is fixed and cannot be optimized. Indeed, if the number of discharges x is reduced by two, for example, to reduce the duration of measurement, the reference capacitance $C_S$ is divided by two according to equation (2), and consequently, the variation $\Delta C_X$ of the capacitance $C_X$ is degraded, since it is multiplied by two according to equation (3). With such a device, there is therefore no means of optimizing the duration of measurement of the capacitive sensor 3 without impacting the variation $\Delta C_X$ of the capacitance $C_X$, that is to say the sensitivity of the capacitive sensor 3.

However, the duration of measurement of the capacitive sensor must be extremely fast, since:

the door opening mechanism must be completely transparent to the driver. Indeed, the latter expects the opening of the door to be as fast as in the case of opening a mechanical handle, not equipped with a capacitive sensor 3, the consumption of the capacitive sensor 3 must be minimized, since it operates for long periods when the vehicle is stopped. Now, consumption being related to the duration of measurement, if the duration of measurement is reduced, consumption decreases.

However, as detailed hereinabove, given that the reduction in the duration of measurement brings about a degradation in the sensitivity of the capacitive sensor 3, this can cause overly late detections. Indeed, a degradation in the sensitivity of the sensor signifies that detection was carried out only when a large variation $\Delta C_X$ of the capacitance $C_X$ was measured. A necessary compromise therefore exists between the duration of measurement and the sensitivity desired, that is to say the variation $\Delta C_X$ of the capacitance $C_X$ desired. It will have been understood that there is a significant advantage in producing a capacitive sensor 3 for which the variation $\Delta C_X$ of the capacitance $C_X$ is independent of the duration of measurement.

A device for measuring a variation $\Delta C_X$ of the capacitance $C_X$ making it possible to alleviate these drawbacks is known from the prior art (cf. FIG. 3). In this instance, document FR 2 938 344 A1 describes a device for measuring a variation $\Delta C_X$ of the capacitance $C_X$ furthermore comprising:

a third capacitance, called the measurement capacitance $C_M$, linked to ground, means (a switch S3) for charging this measurement capacitance on the basis of the supply voltage $V_{CC}$, and means (a switch S4) for discharging the measurement capacitance $C_M$ to the reference capacitance $C_S$ in a variable number of discharges n.

This measurement capacitance $C_M$ makes it possible to carry out the measurement of the variation $\Delta C_X$ of the capacitance $C_X$ in such a way that this variation is independent of the capacitance $C_X$ of the electrode 4 measured. This allows the optimization of the duration of measurement until the detection (that is to say the optimization of the number of charges and/or discharges) of the capacitive sensor 3 without impacting its variation $\Delta C_X$.

According to the invention described in document FR 2 938 344 A1, the charge transfer breaks down into two phases: acquisition and measurement.

The acquisition phase consists of a conventional transfer of charge from the capacitance $C_X$ of the electrode 4 into the reference capacitance $C_S$. The difference with conventional charge transfer, described above, is that the charge transfer stops after a fixed number of discharges x and not when the voltage $V_S$ across the terminals of the reference capacitance $C_S$ attains a voltage threshold $V_{TH}$.

The measurement phase consists of a transfer of charge, of a variable number of discharges n, of the measurement capacitance $C_M$ into the reference capacitance $C_S$ until the voltage $V_S$ across the terminals of the reference capacitance $C_S$ reaches the threshold voltage $V_{TH}$.

During the acquisition phase, the charge of the capacitance $C_X$ of the electrode 4 is transferred into the measurement capacitance $C_S$ in the following manner:

1st step: the first step consists in charging the capacitance $C_X$ of the electrode 4 on the basis of the supply voltage $V_{CC}$. Accordingly the first switch S1 is closed and the second switch S2 is opened, 2nd step: once the charging of the capacitance $C_X$ of the electrode 4 has terminated, the first switch S1 is opened, 3rd step: the discharging of the capacitance $C_X$ of the electrode 4 into the reference capacitance $C_S$ can begin. Accordingly, the first switch S1 remains open and the second switch S2 is closed, 4th step: once the discharging of the capacitance $C_X$ of the electrode 4 into the reference capacitance $C_S$ has been carried out, the second switch S2 is opened.

The third and the fourth switch S3 and S4 are open during this acquisition phase. Consequently, the measurement capacitance $C_M$ is neither charged, nor discharged during this acquisition phase.

This charging and discharging cycle is repeated a predetermined and fixed number of times x.

During the measurement phase, the charge of the measurement capacitance $C_M$ is transferred into the reference capacitance $C_S$ until the voltage $V_S$ across the terminals of this capacitance attains a threshold $V_{TH}$.

1st step: the first step consists in charging the measurement capacitance $C_M$. Accordingly the third switch S3 is closed and the fourth switch S4 is opened, 2nd step: once the charging of the measurement capacitance $C_M$ has terminated, the third switch S3 is opened, 3rd step: the discharging of the measurement capacitance $C_M$ into the reference capacitance $C_S$ can begin. Accordingly, the third switch S3 remains open and the fourth switch S4 is closed, 4th step: once the discharging of the measurement capacitance $C_M$ into the reference capacitance $C_S$ has been carried out, the fourth switch S4 is opened.

The first and the second switch S1 and S2 are open during this measurement phase. Consequently the capacitance $C_X$ of the electrode 4 is neither charged, nor discharged during this measurement phase.

This cycle is repeated until the voltage $V_S$ across the terminals of the reference capacitance $C_S$ attains the threshold voltage $V_{TH}$. The variable number of discharges (called n) required to attain the threshold represents an image of the capacitance $C_X$. The reference capacitance $C_S$ is thereafter completely discharged by closing the switch S in preparation for the next measurement.

Thus, according to document FR 2 938 344 A1, the variation $\Delta C_X$ of the capacitance $C_X$ is no longer dependent on the capacitance $C_X$ of the electrode 4, but it is defined according to equation (4):

$$\Delta C_X = \frac{Th \times C_M}{x} \quad (4)$$

That is to say the variation $\Delta C_X$ of the capacitance $C_X$ depends on the measurement capacitance $C_M$, on the fixed number of discharges x of the electrode $C_X$ into the measurement capacitance $C_S$ and on the detection threshold Th. And n, the variable number of discharges of the measurement capacitance $C_M$ to the reference capacitance $C_S$ is defined by:

$$n = -\frac{C_S \times \ln\left(1 - \frac{V_{TH}}{V_{CC}}\right) + x \times C_X}{C_M} \quad (5)$$

The measurement capacitance $C_M$ being fixed, so is the fixed number of discharges x, and the detection threshold Th also being determined and fixed (since it is equivalent to a number of discharges n of the measurement capacitance $C_M$ into the reference capacitance $C_S$ corresponding to the threshold for detecting the driver's hand on the handle 6 of the door), it is therefore possible to choose the variation $\Delta C_X$ of the capacitance $C_X$ by choosing in correspondence the values of $C_M$, x, and of Th, independently of the value of the capacitance $C_X$. Thus the variation $\Delta C_X$ of the capacitance $C_X$ no longer depends on the value of this capacitance $C_X$.

However, a major drawback of this device is the presence of parasitic residual capacitances originating from the switches S3 and S4 used to charge and discharge the measurement capacitance $C_M$. The consequence of these residual capacitances is to limit the minimum value of the measurement capacitance $C_M$, below which the variation $\Delta C_X$ of the capacitance $C_X$ can no longer be improved (decreased). Generally, a switch exhibits a residual capacitance of 5 pF. The two switches S3 and S4 therefore exhibit an aggregate residual capacitance of 2×5=10 pF. The value of the measurement capacitance $C_M$ must be chosen as a function of this cumulated residual capacitance, and generally its value is chosen to be equal to this residual capacitance, i.e. of the order of 10 pF. The variation $\Delta C_X$ of the capacitance $C_X$ (the smallest value of the variation $\Delta C_X$ measurable) therefore attains a minimum when the measurement capacitance $C_M$=10 pF and it can no longer be optimized with the prior art device described in document FR 2 938 344 A1. In an exemplary use, if Th=5, if x=170 and if $C_M$=10 pF (minimum value due to the residual capacitances of the two switches S3 and S4), then the variation $\Delta C_X$ of the capacitance $C_X$ is equal to 0.3 pF. Now, if it were possible to lower the value of the measurement capacitance $C_M$, the variation $\Delta C_X$ of the capacitance $C_X$ would be improved (decreased) proportionately but this is not possible since the circuit already exhibits a residual capacitance of 10 pF.

SUMMARY OF THE INVENTION

The invention proposes a device for measuring a variation $\Delta C_X$ of a capacitance $C_X$ making it possible to alleviate this drawback. More precisely, the invention proposes a device in which the variation $\Delta C_X$ of the capacitance $C_X$ is improved with respect to that obtained in the prior art.

Accordingly, the invention proposes a device for measuring a variation $\Delta C_X$ of a capacitance, comprising:

a supply voltage, means for charging the capacitance on the basis of the supply voltage, means for discharging the capacitance into a reference capacitance $C_S$ in a fixed number of discharges x, means for measuring a voltage $V_S$ across the terminals of the reference capacitance $C_S$, means for detecting a threshold of voltage $V_{TH}$ across the terminals of the reference capacitance $C_S$, the invention residing in the fact that the device furthermore comprises:

means for charging with current the reference capacitance $C_S$ on the basis of the supply voltage $V_{CC}$ for a duration t, after the capacitance $C_X$ has been charged and discharged in a fixed number of discharges x into the reference capacitance $C_S$, means $R_C$ for calibrating the current, charging the reference capacitance $C_S$, means for:

measuring the duration t with a temporal resolution $\Delta t$, and computing the variation of this duration t with respect to a previously measured duration, this variation being representative of the variation $\Delta C_X$ of the capacitance $C_X$.

According to the invention, a predetermined threshold of detection Th of a number of intervals of the temporal resolution over the duration t is defined, corresponding to the variation $\Delta C_X$ of the capacitance.

Advantageously, the fixed number of discharges x of the capacitance to the reference capacitance $C_S$ is defined by:

$$x = \frac{Th \times \Delta t}{\Delta C_X \times R_c}$$

The duration t is defined by the duration required for the voltage $V_S$ across the terminals of the reference capacitance $C_S$ to be equal to the voltage threshold $V_{TH}$ and is equal to:

$$t = -R_C \times C_S \times \ln\left(\frac{V_{CC} - V_{TH}}{V_{CC} - V_S(x)}\right)$$

The measurement of the capacitance variation $\Delta C_X$ is independent of the capacitance $C_X$ and is equivalent to:

$$\Delta C_X = \frac{Th \times \Delta t}{R_C \times x}$$

In a preferential embodiment, the reference capacitance $C_S$ exhibits a greater capacitance than that of the capacitance.

The invention also relates to any capacitive sensor for detecting the presence of a user of an apparatus, implementing a device for measuring a variation of the capacitance according to any one the characteristics hereinabove, such that the capacitance whose capacitance variation $\Delta C_X$ is measured comprises a detection electrode disposed within said apparatus, the capacitance being measured between said detection electrode and a close environment of said detection electrode.

Judiciously, the apparatus in which the detection electrode is disposed is a door handle of a vehicle.

The invention applies to any motor vehicle comprising a capacitive sensor such as described previously as well as the associated method for measuring a variation $\Delta C_X$ of the capacitance $C_X$.

BRIEF DESCRIPTION OF THE DRAWINGS

Other characteristics and advantages of the invention will become apparent on reading the description which follows and on examining the appended drawings in which.

DETAILED DESCRIPTION OF THE PREFERRED EMBODIMENTS

Figure 1:
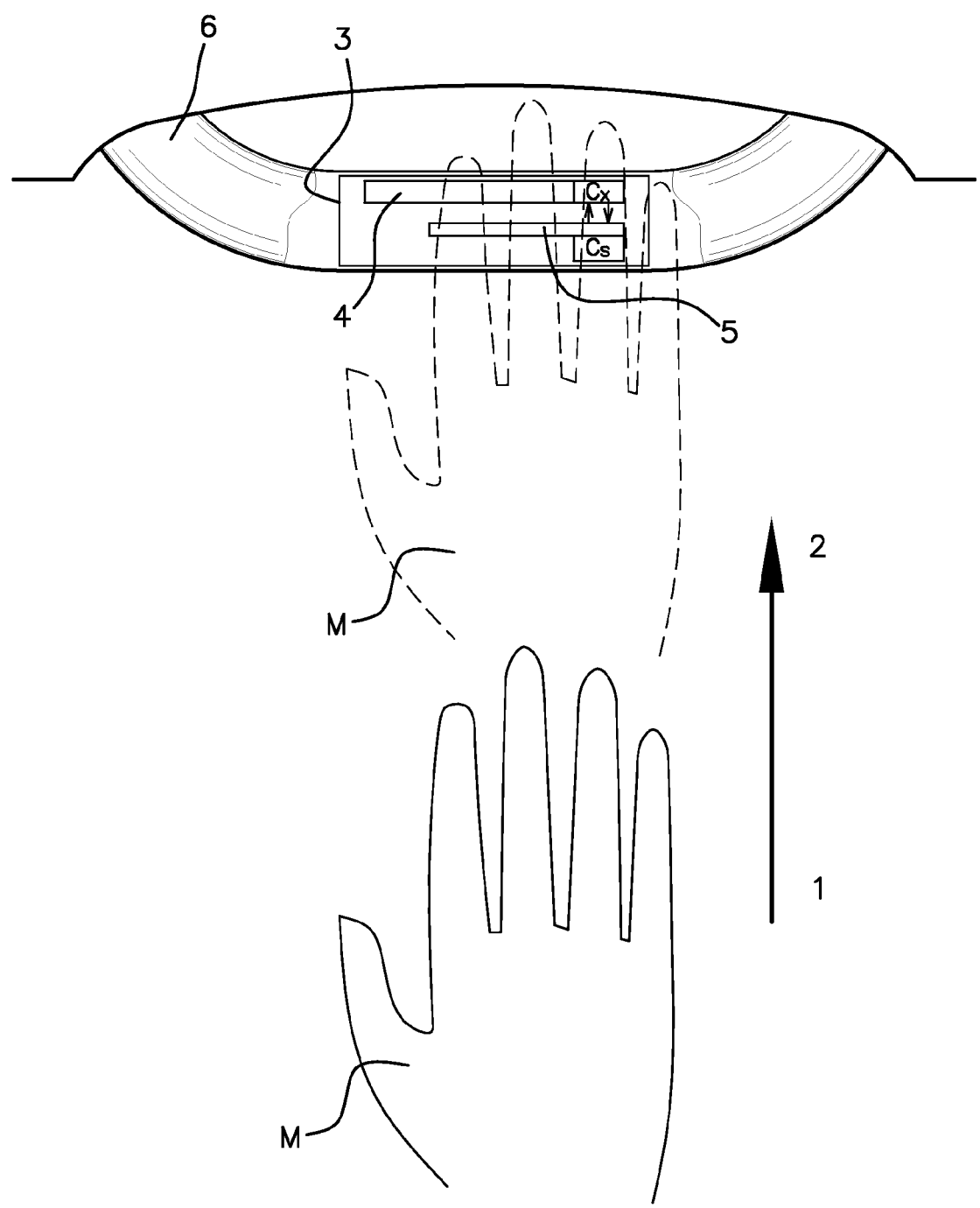
FIG. 1 represents a schematic view, described previously, of a door handle of a vehicle integrating a charge-transfer capacitive sensor.
Figure 2:
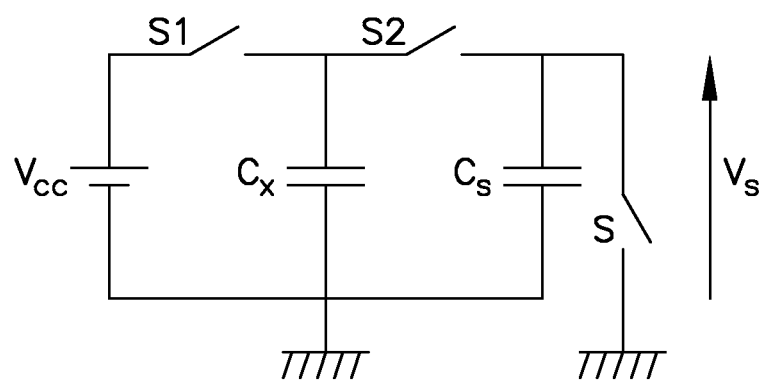
FIG. 2 represents a schematic view, described previously, of a charge-transfer capacitive sensor according to the prior art.
Figure 3:
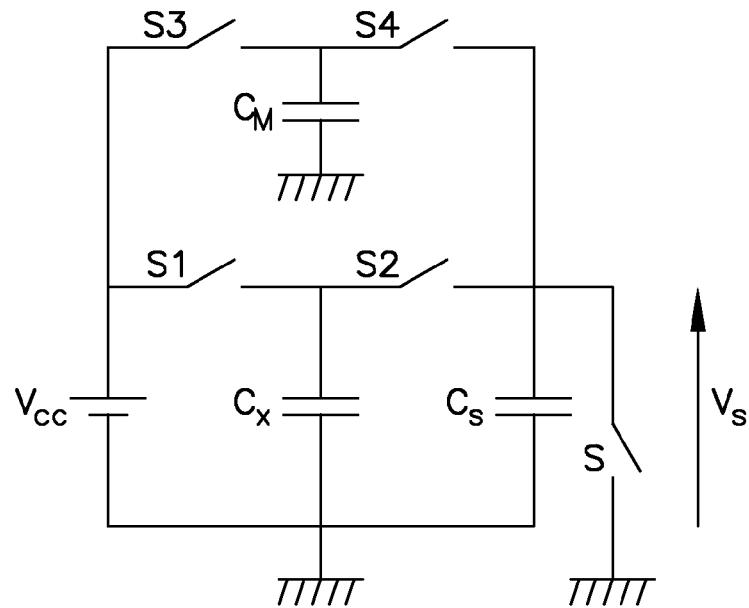
FIG. 3 represents a schematic view of a charge-transfer capacitive sensor according to the prior art, described in FR 2 938 344 A1.
Figure 4:
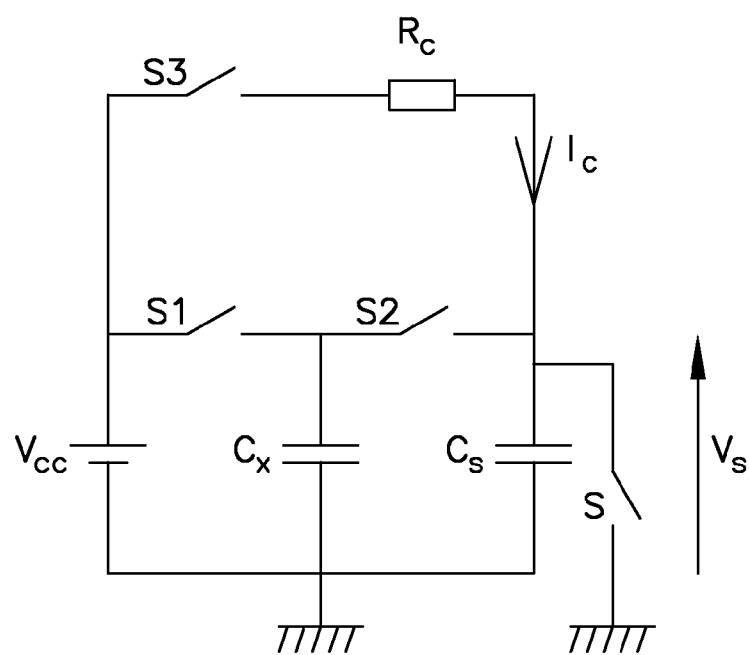
FIG. 4 represents a schematic view of a charge-transfer capacitive sensor, according to the invention.

The invention proposes the device, such as illustrated in FIG. 4, for measuring a variation $\Delta C_X$ of the capacitance $C_X$ and which comprises, furthermore, a charge resistance $R_C$, placed between the supply voltage $V_{CC}$ and the measurement capacitance $C_S$.

The charge transfer according to the invention breaks down into two phases: acquisition and measurement.

The acquisition phase is identical to that of the prior art. During this acquisition phase, the capacitance $C_X$ of the electrode 4 charges and discharges into the reference capacitance $C_S$ in a fixed number of discharges x, as described previously.

During the measurement phase, according to the invention, a charge current $I_C$ passing through the charge resistance $R_C$ charges the reference capacitance $C_S$ until the voltage $V_S$ across the terminals of the latter attains the threshold value $V_{TH}$.

The single step of this measurement phase consists in the charging of the reference capacitance $C_S$ by the charge current $I_C$ passing through the charge resistance $R_C$. Accordingly, the third switch S3 is closed.

The first and the second switches S1 and S2 are open during this measurement phase. Consequently the capacitance $C_X$ of the electrode 4 is neither charged, nor discharged during this measurement phase.

Charging continues until the voltage $V_S$ across the terminals of the reference capacitance $C_S$ attains the threshold voltage $V_{TH}$. The duration t of charging required to reach the threshold $V_{TH}$ represents an image of the capacitance $C_X$. The duration t is therefore measured between the closing of the third switch S3 and detection (that is to say the instant corresponding to $V_S = V_{TH}$). The charge current $I_C$ charging the reference capacitance $C_S$ is constant and calibrated by passage through the charge resistance $R_C$. By changing the value of the charge resistance $R_C$, the intensity of the charge current $I_C$ also changes as well as the duration t of charging into the reference capacitance $C_S$.

The reference capacitance $C_S$ is thereafter completely discharged by closing the switch S in preparation for the next measurement.

According to the invention, the equations governing the operation of the capacitive sensor 3 at low consumption are the following:

during the acquisition phase, the evolution of the voltage $V_S$ across the terminals of the reference capacitance $C_S$ is given by equation (1), during the measurement phase, the duration t of charging required in order that $V_S = V_{TH}$ is defined.

$$V_{TH} = (V_{CC} - V_S(x)) \times \left(1 - e^{-\frac{t}{R_C \times C_S}}\right) + V_S(x)$$

Which is equivalent to:

$$\frac{V_{CC} - V_{TH}}{V_{CC} - V_S(x)} = e^{-\frac{t}{R_C \times C_S}}$$

Then to:

$$-\frac{t}{R_C \times C_S} = \ln\left(\frac{V_{CC} - V_{TH}}{V_{CC} - V_S(x)}\right)$$

And finally:

$$t = -R_C \times C_S \times \ln\left(\frac{V_{CC} - V_{TH}}{V_{CC} - V_S(x)}\right) \quad (6)$$

The duration t is measured with a time base Δt, which is the temporal measurement precision of a clock of the printed circuit 5. This time base Δt (or temporal resolution) is therefore fixed by the clock of the printed circuit 5. The number of intervals of precision Δt included in the duration t is called y, i.e. y=t/Δt, and we obtain:

$$y \times \Delta t = -R_C \times C_S \times \ln\left(\frac{V_{CC} - V_{TH}}{V_{CC} - V_S(x)}\right)$$

Which is equivalent to:

$$y \times \Delta t = -R_C \times C_S \times \ln\left(\frac{V_{CC} - V_{TH}}{V_{CC} - V_{CC} \times \left(1 - \left(1 - \frac{C_X}{C_S}\right)^x\right)}\right)$$

Then, $$y \times \Delta t = -R_C \times C_S \times \ln\left(\frac{V_{CC} - V_{TH}}{V_{CC} \times \left(1 - \frac{C_X}{C_S}\right)^x}\right)$$

Isolating y, we obtain:

$$y = -\frac{R_C \times C_S}{\Delta t} \times \left[\ln\left(1 - \frac{V_{TH}}{V_{CC}}\right) - \ln\left(\left(1 - \frac{C_X}{C_S}\right)^x\right)\right]$$

Then, $$y = -\frac{R_C \times C_S}{\Delta t} \times \left[\ln\left(1 - \frac{V_{TH}}{V_{CC}}\right) - x \times \ln\left(1 - \frac{C_X}{C_S}\right)\right]$$

The finite series expansion of $$\ln\left(1 - \frac{C_X}{C_S}\right) \cong -\frac{C_X}{C_S},$$

since the value of the reference capacitance $C_S$ is appreciably greater than the value of the capacitance $C_X$ of the electrode 4. We thus obtain:

$$y = -\frac{R_C \times C_S}{\Delta t} \times \left[\ln\left(1 - \frac{V_{TH}}{V_{CC}}\right) + x \times \frac{C_X}{C_S}\right]$$

Then, $$y = -\frac{R_C}{\Delta t} \times \left[C_S \times \ln\left(1 - \frac{V_{TH}}{V_{CC}}\right) - x \times C_X\right]$$

We define Th to be the variation of y giving rise to a detection, hence Th is equivalent to:

$$Th = \frac{R_C}{\Delta t} \times$$

$$\left[-C_S \times \ln\left(1 - \frac{V_{TH}}{V_{CC}}\right) - x \times C_X + C_S \times \ln\left(1 - \frac{V_{TH}}{V_{CC}}\right) + x \times (C_X + \Delta C_X)\right]$$

i.e. also:

$$Th \times \frac{\Delta t}{R_C} = x \times \Delta C_X$$

And finally:

$$\Delta C_X = \frac{Th \times \Delta t}{R_C \times x} \quad (7)$$

Thus, according to equation (7) of the invention, the variation $\Delta C_X$ of the capacitance $C_X$, is determined by:
the fixed number of discharges x of the acquisition cycle,
the value of the charge resistance $R_C$, and
the time base Δt (temporal resolution of the printed circuit 5 clock).

It is thus possible to increase the value of the charge resistance $R_C$ so as to improve the variation $\Delta C_X$ of the capacitance $C_X$, that is to say so as to improve the sensitivity of the capacitive sensor 3.

It is also possible, by way of software, to reduce the temporal resolution Δt of the clock of the printed circuit 5 so as to improve the variation $\Delta C_X$ of the capacitance $C_X$.

The advantage of the invention is therefore a reduction in detection time (and therefore a reduction in the consumption of the capacitive sensor 3) with respect to the prior art and/or an increase in detection precision due to the reduction in the variation $\Delta C_X$ of the capacitance $C_X$ of the electrode 4 which is measurable by the capacitive sensor 3.

An example of gain in time and precision is illustrated hereinbelow.

Consider a capacitive sensor 3 with the following characteristics:
$C_X$=35 pF,
Th=5,
$V_{TH}$=1.1V,
$V_{CC}$=3.3V,
$C_S$=20 nF,
x=170.

According to the solution of the prior art, that is to say according to the invention described in FR 2 938 344 A1, by using a measurement capacitance $C_M$, of minimum value, i.e. $C_M$=10 pF (residual capacitance), then according to equation (5), the number n of charge transfers until $V_S$=$V_{TH}$, is equal to n=215.

And the total cycle number N=(n+x) to carry out the charge transfer is equal to 385. With a clock having a resolution of Δt=2 μs, a charge transfer lasts 12 μs. The duration of the 385 charge transfers, that is to say the duration of detection is therefore 4.6 ms (385×0.12). And according to equation (4), the variation $\Delta C_X$ of the capacitance $C_X$ is equal to $\Delta C_X$=0.3 pF.

According to the invention of the present patent application, by fixing the charge resistance $R_C$=200 kΩ and a resolution of the clock of the printed circuit 5 identical to that of the previous example (Δt=2 μs), then:
$V_S(x)$ according to equation (1) equals $V_S(170)$=0.849 V, according to equation (6), the duration t is equal to t=430 μs, i.e. 0.43 ms, the duration of the x=170 charge transfers of the capacitance $C_X$ into the reference capacitance $C_S$ is equal to 2.04 ms (170×0.12), the total duration of detection is therefore equal to 2.47 ms (2.04+0.43) i.e. a duration of detection 1.84 times shorter than that of the prior art (4.6 ms).

The charge transfer device according to the invention makes it possible to significantly reduce the measurement time t and consequently the consumption of the capacitive sensor 3.

In another example, by increasing the value of the charge resistance $R_C$ to $R_C$=800 kΩ so as to decrease the value of the variation $\Delta C_X$ of the capacitance $C_X$, then:

according to equation (6), the variable duration t=1.723 ms, and the total duration of detection is equal to 3.76 ms (1.723+ 2.04), i.e. a duration 0.82 times shorter than that of the prior art (4.6 ms), and variation $\Delta C_X$ of the capacitance $C_X$, according to equation (7) is equal to $\Delta C_X$=0.073 pF, i.e. a variation $\Delta C_X$ divided by four with respect to that of the prior art.

The invention therefore allows faster and/or much more precise detection of approach of the user's hand by the capacitive sensor than the prior art solution described in document FR 2 938 344 A1.

The invention is not limited to the embodiments described. In particular, the invention applies to any device for measuring a variation of a capacitance and is not limited to the detection of the approach of a user's hand to a door handle of a vehicle.

The invention claimed is:

1. A device for measuring a variation ($\Delta C_X$) of a capacitance ($C_X$), comprising:
   a supply voltage ($V_{CC}$);
   circuitry that charges the capacitance ($C_X$) on the basis of the supply voltage ($V_{CC}$);
   circuitry that discharges the capacitance ($C_X$) into a reference capacitance ($C_S$) in a fixed number of discharges (x);
   circuitry that measures a voltage ($V_S$) across the terminals of the reference capacitance ($C_S$);
   circuitry that detects a threshold of voltage ($V_{TH}$) across the terminals of the reference capacitance ($C_S$);
   circuitry that charges, with current ($I_C$), the reference capacitance ($C_S$) on the basis of the supply voltage ($V_{CC}$) for a duration (t), after the capacitance ($C_X$) has been charged and discharged in a fixed number of discharges (x) into the reference capacitance ($C_S$);
   a charge resistance ($R_C$) that calibrates the current ($I_C$), charging the reference capacitance ($C_S$); and
   circuitry that:
      measures the duration (t) with a temporal resolution ($\Delta t$), and
      determines a variation of the duration (t) with respect to a previously measured duration, the variation being representative of the variation ($\Delta C_X$) of the capacitance ($C_X$).

2. The device as claimed in claim 1, wherein a predetermined threshold of detection (Th) of a number (y) of intervals of the temporal resolution ($\Delta t$) over the duration (t) is defined, corresponding to the variation ($\Delta C_X$) of the capacitance ($C_X$).

3. The device as claimed in claim 2, wherein the fixed number of discharges (x) of the capacitance ($C_X$) to the reference capacitance ($C_S$) is defined by:

$$x = \frac{Th \times \Delta t}{\Delta C_X \times R_c}$$

with:
Th: the detection threshold
$\Delta t$: the temporal resolution
$\Delta C_X$: the variation of the capacitance ($C_X$)
$R_C$: the charge resistance.

4. The device as claimed in claim 1, wherein the duration (t) is defined by the duration required for the voltage ($V_S$) across the terminals of the reference capacitance ($C_S$) to be equal to the voltage threshold ($V_{TH}$) and is equal to:

$$t = -R_C \times C_S \times \ln\left(\frac{V_{CC} - V_{TH}}{V_{CC} - V_S(x)}\right)$$

with:
$C_S$: the reference capacitance
$V_{CC}$: the supply voltage
$V_{TH}$: the voltage threshold
$V_S$: the voltage across the terminals of the reference capacitance ($C_S$).

5. The device as claimed in claim 2, wherein the measurement of the capacitance variation ($\Delta C_X$) is independent of the capacitance ($C_X$), and is equivalent to:

$$\Delta C_X = \frac{Th \times \Delta t}{R_C \times x}$$

where x is the number of fixed discharges of the capacitance ($C_X$) into the reference capacitance ($C_S$).

6. The device as claimed in claim 1, wherein the reference capacitance ($C_S$) exhibits a greater capacitance than that of the capacitance ($C_X$).

7. A capacitive sensor for detecting the presence of a user of an apparatus that implements the device for measuring a variation of the capacitance ($C_X$) as claimed in claim 1, wherein the capacitance ($C_X$) whose capacitance variation ($\Delta C_X$) is measured comprises a detection electrode (4) disposed within said apparatus, the capacitance ($C_X$) being measured between said detection electrode (4) and a close environment (M) of said detection electrode (4).

8. The capacitive sensor as claimed in claim 7, wherein the apparatus in which the detection electrode (4) is disposed is a door handle (6) of a vehicle.

9. A motor vehicle comprising a capacitive sensor (3) as claimed in claim 8.

10. A method for measuring a variation ($\Delta C_X$) of the capacitance ($C_X$), using a measurement device as claimed in claim 1, comprising the steps of:
   charging with current ($I_C$), said current ($I_C$) being constant and calibrated by passage through a charge resistance ($R_C$), the reference capacitance ($C_S$) on the basis of the supply voltage ($V_{CC}$) for a duration (t), after the capacitance ($C_X$) has been charged and discharged in a fixed number of discharges (x) into the reference capacitance ($C_S$);
   measuring the duration (t) with a temporal resolution ($\Delta t$); and
   computing the variation of this duration (t) with respect to a previously measured duration, the variation being representative of the variation ($\Delta C_X$) of the capacitance ($C_X$).

* * * * *